United States Patent [19]

Gilles

[11] 4,296,426
[45] Oct. 20, 1981

[54] PROCESS FOR PRODUCING AN MOS-TRANSISTOR AND A TRANSISTOR PRODUCED BY THIS PROCESS

[75] Inventor: Jean Gilles, Paris, France

[73] Assignee: Thomson-CSF, Paris, France

[21] Appl. No.: 11,923

[22] Filed: Feb. 13, 1979

[30] Foreign Application Priority Data

Feb. 17, 1978 [FR] France ............................ 78 04528

[51] Int. Cl.³ .......................................... H01L 29/78
[52] U.S. Cl. ....................................... 357/23; 148/1.5; 148/187; 148/188; 148/190; 29/571; 29/589
[58] Field of Search ................. 29/571, 589; 148/187, 148/1.5, 188, 190; 357/23

[56] References Cited

U.S. PATENT DOCUMENTS 3,895,978  7/1975  Tarui et al. ......................... 148/187

OTHER PUBLICATIONS

IBM Tech. Discl. Bull., vol. 20, No. 1, Jun. 1977, pp. 146–148.

Primary Examiner—G. Ozaki
Attorney, Agent, or Firm—Cushman, Darby & Cushman

[57] ABSTRACT

A process for producing a field-effect insulated-gate transistor of the N-channel MOS-type, transistor comprising, on a semiconductor substrate, a control gate (14) and a source region (12), a drain region (13) and a channel region (15, 16), which comprises a characteristic step in which these three regions are formed by the simultaneous diffusion of impurities from sources (20) of polycrystalline silicon doped with two types of impurities, these sources then being preserved to form the contact electrodes between the regions created and the outer contacts (50).

13 Claims, 3 Drawing Figures

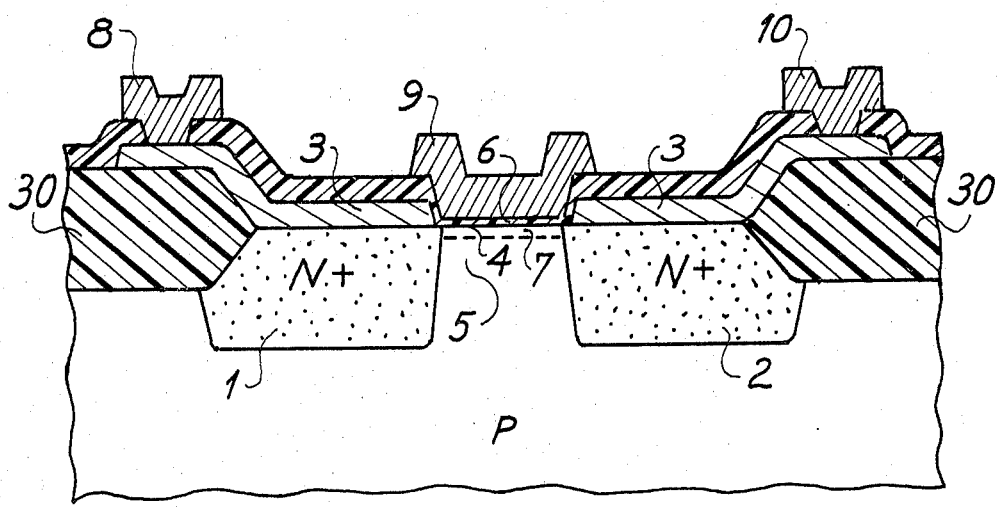
Fig_1
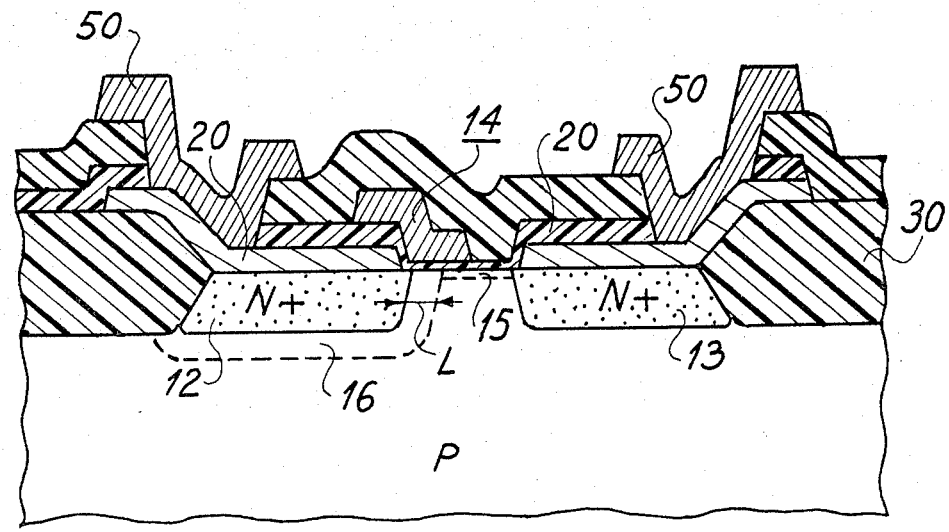
Fig_2

PROCESS FOR PRODUCING AN MOS-TRANSISTOR AND A TRANSISTOR PRODUCED BY THIS PROCESS

This invention pertains in general to semiconductor devices belonging to the family of insulated-gate field-effect transistors and pertains specifically to a process for producing transistors of this type comprising a so-called "N" channel.

This use in increasing numbers of transistors of the type, particularly in the construction of electronic circuits for memories, has prompted constant efforts to reduce their dimensions, particularly for satisfying the requirements of monolithic integration on a very large scale, and has made it necessary to adopt production processes rendering increasingly more precise the delimitation of the various zones of the surface of the semiconductor substrate where the transistors are formed.

The photomasking techniques normally used have limitations in cases where dimensions of the order of 1000th of a millimeter are necessary for a given electrode. As will be shown in more detail hereinafter, an essential feature of the present invention is that these photomasking processes are replaced by a process for forming regions of minuscule dimensions by the controlled diffusion of impurities previously included in adjacent regions of less critical dimensions. Accordingly, the regions thus created are automatically positioned in relation to regions which are easy to position in the first place.

According to the invention, a process such as this is used both for creating the drain and source regions of the transistors from a source of doping impurities formed by a deposit of polycrystalline silicon and for creating and defining the precise length of the channel from the source region by a mechanism of simultaneous double diffusion to controlled depths.

Significant reductions in dimensions relative to the conventional photomasking techniques are thus obtained with typical channel lengths of the order of only 1000th of a millimetre.

There is also another problem which is assuming increasing significance in efforts to reduce the dimensions of the transistors, namely the establishment of conductive contacts on the various electrodes. In transistors produced by photomasking processes, these contacts, particularly the drain contacts, have to be separated by considerable safety distances from the insulating layers of silicon oxide and from the sides of the gate.

Another advantage of the process according to the invention is that it enables these safety intervals to be reduced, thus affording the possibility of a higher integration density by having the contact function performed by those regions which have served as sources of doping impurities in a previous diffusion step mentioned above.

Accordingly, the invention lies essentially in a process for producing a field-effect transistor having an insulated gate and an N-type channel, which in the interests of simplicity will be referred to hereinafter as an N-MOS-transistor, where on the one hand the length of the channel is defined by diffusion from doped regions of the substrate and, on the other hand, the contact functions are performed by layers of a material which has served as an impurity source for the creation of these regions.

Since the respective conductivity types of these doped regions and the channel to which they give rise have to be opposite in sign, as known from field-effect transistors, it is important to point out that, according to one important aspect of the invention, simultaneous double doping with the two impurities required has to be carried out during the creation of one of the doped regions, the difference between their respective diffusion rates ensuring the creation of the region of the channel by a mechanism of geometric difference.

Accordingly, the present invention relates more particularly to a process for forming an N-MOS-transistor in a wafer-like substrate of P-type conductivity, comprising the following steps:

forming a field layer of silicon oxide on one face of the substrate and forming an opening in this layer to expose the surface of the substrate;

depositing a layer of polycristalline silicon doped with an N-type impurity over the entire face;

forming a mask on a portion of the face of the substrate comprising an edge of the opening in the oxide field layer and doping the unmasked portion of the layer of polycrystalline silicon with a P-type impurity;

forming another layer of silicon oxide on the layer of polycrystalline silicon and forming a common opening in these two layers to expose the surface of the substrate;

simultaneously forming source, drain and channel regions by the solid diffusion of impurities included in the layer of polycrystalline silicon;

creating a control gate on the layer of silicon oxide produced in the common opening by this diffusion step;

forming another layer of oxide over the entire face of the substrate;

forming openings in this other layer to expose the surface of the layer of polycrystalline silicon and depositing metallic contacts with this last layer on the source and drain regions and on the gate.

The invention will be better understood from the following description in conjunction with the accompanying drawings, wherein:

FIG. 1 is a section through an N-MOS-transistor of known structure;

FIG. 2 is a section through an N-MOS-transistor produced by the process according to the invention.

FIG. 1 shows an N-MOS-transistor of known structure in a section perpendicular to the useful or upper face of the block of silicon on which the transistor is formed.

Figure 3A:
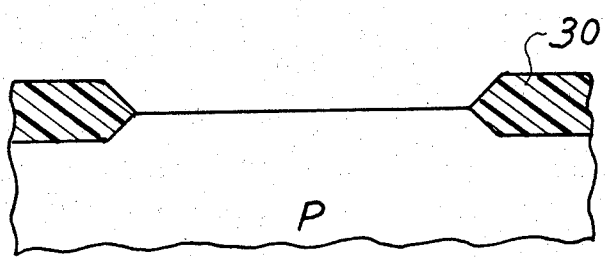
FIG. 3 shows in section the various steps according to the invention of the process for forming the transistor corresponding to FIG. 2, these various steps being marked (a) to (i).
Figure 3B:
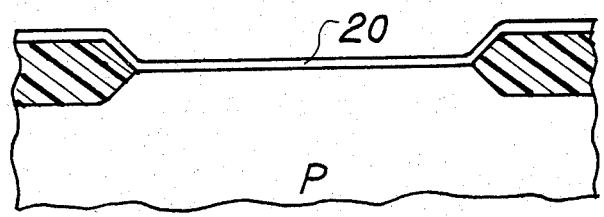
Figure 3C:
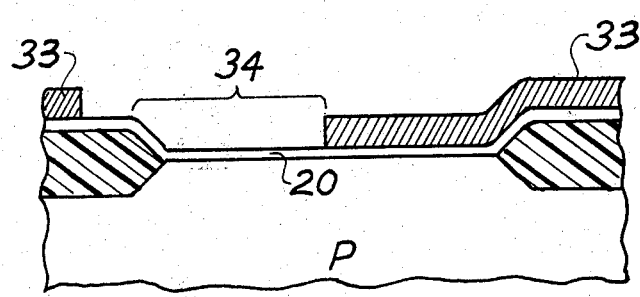
Figure 3D:
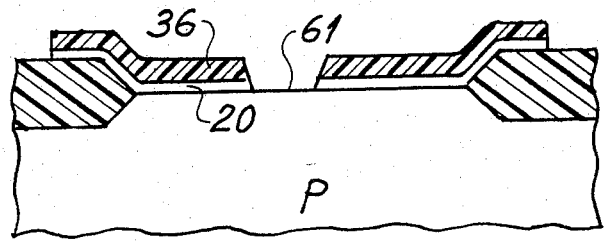
Figure 3E:
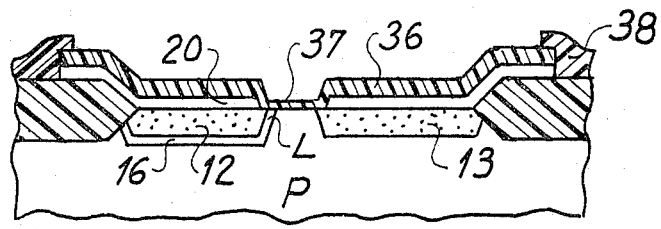

This transistor, which is formed in a block-like substrate of P-type conductivity, comprises a source electrode 1 and a drain electrode 2, both formed by heavily (N+) doped regions of N-type conductivity.

In one known process, these regions are formed by the diffusion of N-type impurities from a reservoir formed by a layer 3 of doped polycrystalline silicon, in which an opening 4 intended to delimit the intermediate region 5 representing the channel of the transistor has been formed by a conventional photomasking process.

By suitably selecting the level of doping of this region, the deposit of a layer 6 of oxide on its surface determines the formation of a charge layer 7 opposite in sign to the semiconductor P, i.e. of sign N, this layer normally being referred to as the inversion layer.

Contacts 8, 9 and 10 are established on the respective source, gate and drain regions, the contact 9 forming the gate.

The regions 3 of polycrystalline silicon are perfectly adaptd to the contacts on the regions 1 and 2 which they have created, such as the contacts 8 and 10.

On the other hand, a structure such as this for an N-MOS-transistor may not readily accommodate dimensions smaller than those corresponding to a length of 4 to 5μ for the channel, because the regions 3 of polycrystalline silicon which define the length of the channel are created by photomasking of which the limits of precision are reached for these orders of magnitude.

FIG. 2 shows an N-MOS-transistor formed by the process according to the invention.

This transistor comprises a source 12, a drain 13 and a control gate 14 similar to those of the transistor shown in FIG. 1. However, its channel comprises two parts electrically in series over its length. The normal part 15 which represents the N-type channel formed by the charge inversion layer; and another part 16, of P-type conductivity and heavily doped, which forms a first channel section of length L.

Figure 3F:
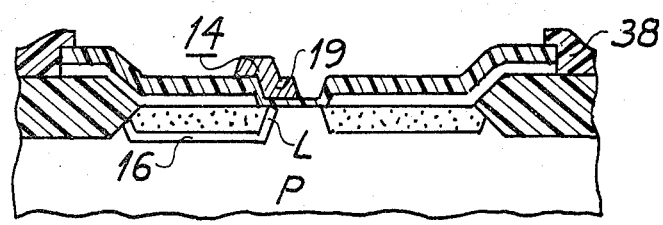
Figure 3G:
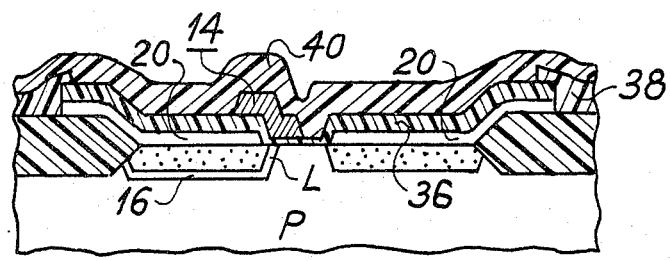
Figure 3H:
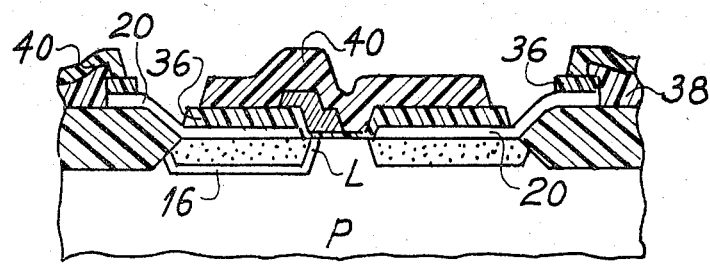
Figure 3I:
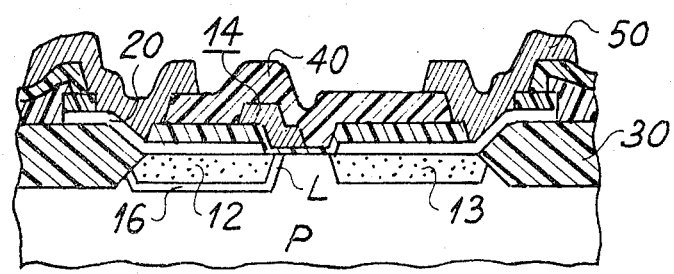

It is this section L in conjunction with the gate 14 which essentially controls the passage of current between the source and the drain, whilst the rest of the channel, namely the N-type inversion layer, behaves virtually like a region of low resistivity approaching the short-circuit level. It should be noted that the action of the gate on this second section is thus negligible and that, in practice, the gate may be confined to its part 19, (see FIG. 3(f)) towards the source.

It is the object of the present invention to form a transistor such as this by a process which enables the length L of the P-type section 16 of the channel to be controlled with precision and to be reduced to a value considerably smaller than the channel lengths obtained by conventional processes, typically of the order 1μ.

FIG. 3 shows the successive steps involved in the process according to the invention in a succession of diagrams marked (a) to (i).

Step (a) consists in creating a layer 30 of silicon oxide on a block substrate or "wafer" of silicon and in defining thereon that part of the surface of the block where the transistor is to be formed by known photomasking processes.

In step (b), the wafer is covered with a layer of polycrystalline silicon (20) doped with an N-type impurity, such as arsenic, having a thickness of approximately 3000 Å. This layer is formed by a vapour-phase deposit obtained by the decomposition of silane at a temperature of the order of 700° C. either at atmospheric pressure or under low pressure. The layer is doped either during deposition by introduction of the doping impurity in the reaction chamber, or by ion implantation to a depth equivalent to less than the thickness of the polycrystalline layer.

In step (c), a mask of photosensitive resin (33) is deposited. It is etched by a conventional photoetching process with exposure through a mask and development to form an asymmetrical window 34 extending over the future source and gate regions. A P-type doping impurity, such as boron, is introduced by ion implantation through this window with an energy level sufficient to ensure that it only penetrates into the layer 20. The polycrystalline silicon of the future source zone is thus simultaneously doped with N-type and P-type impurities.

The layer 33 is then eliminated, for example in an acid solution or in an oxygen plasma.

In step (d), an oxide layer (36) having a thickness of 5000 Å is then deposited at low temperature, for example at a temperature below 800° C., and etched by a photoetching process so as to eliminate it from above the future region of the channel and the oxide field regions.

This oxide layer acts as a mask in the following etching operation of which the purpose is to eliminate the layer 20 of polycrystalline silicone in the channel region 61. As shown in the figure, this opening is situated on the boundary defining the two zones, respectively, formed by the P- and N-doped polycrystalline silicon and the exclusively N-doped polycrystalline silicone. This etching operation may be carried out in an acid or basic solution or in a plasma of freon.

The following step (e) represents the fundamental operation of the process according to the invention.

It consists in heating the wafer to a high temperature, typically of the order of 800° C. to 1050° C., the effect of which is to cause a simultaneous diffusion of the doping impurities contained in the polycrystalline silicon 20 towards the silicon of the substrate. This operation enables the drain, source and channel regions of the transistor 13, 12 and 16, respectively, to be obtained. The P-type region of the channel 16 can only be obtained if the N-type and P-type doping impurities are selected with different coefficients of diffusion. In particular, for a N-channel structure, the P-type doping impurity will be boron, and the N-type doping impurity is arsenic, so that the coefficient of diffusion of the boron is greater than that of the arsenic and enables it to diffuse over a wider area, creating the P-type region of the channel 16.

The channel region thus appears to be formed by the "face" of the diffused region which opens at the surface of the wafer and which, by its thickness, defines the length L of the channel. The length of the channel is no longer connected to the use of geometric photomasks, as in conventional processes, but instead is merely determined by the duration of a heat treatment, the choice of this duration enabling the length of the channel to be defined with precision. The limitations of optical processes using photomasks are thus overcome, which affords the possibility of obtaining channels less than 1μ in length.

At the same time, the silicon of the substrate is oxidized in the region of the channel, forming the gate insulating oxide 37, and covering the sides of the layers 36 and 20 with a layer of oxide 38.

In step (f), the control gate of the transistor is formed.

It may consist of a refractory metal, such as molybdenum, or of polycrystalline silicon.

Another layer of polycrystalline silicon with N-type or P-type doping, or of refractory metal, is then deposited and etehced to form the gate 14 of the MOS-transistor thus formed. As explained above, it only covers that portion situated above the diffused channel by its part 19.

Step (g) shows the following phase in which a final insulating layer 40 is formed, preferably consisting of a silicon oxide doped with phosphorus in a proportion such that, by a subsequent heat treatment, this layer flows and covers the entire surface including the more rounded reliefs. In step (h), this layer is etched by conventional photoetching means, so that it is left with openings to enable contacts to be formed on the regions 20 and 14 by perforation of the layers 36 and 40.

Finally, in step (i), a layer 50 of a metal of high conductivity, for example aluminium or an aluminium-silicon or aluminium-copper alloy, is deposited with delimitation by photoetching to form the actual contacts on the layers 20 and 14 of polycrystalline silicon.

The process according to the invention has many significant advantages. Firstly, it may be recalled that the channel of the transistor is defined by diffusion and not by photoetching and that, as already mentioned, the length of the channel may thus be reduced to values of the order of 1 micron. The structure is thus rapid and may be used for UHF transistors and rapid circuits.

Secondly, the contacts on the drain and source are "automatically positioned," by virtue of the fact that the polycrystalline silicon acts both as a conductor and as a doping source for the drains and sources.

This property makes it possible to reduce the surface of these regions when a contact is to be formed thereon.

Another advantage of the process according to the invention lies in the fact that it provides for the formation of contacts 50 which project beyond both the oxide field regions and beyond the source and drain regions, which enables the surface of the drain to be reduced whilst, at the same time, maintaining sufficient contacts. This results in a reduction in the capacity of this region relative to the substrate.

Yet another advantage of the process according to the invention lies in the fact that the doping of the drain and the doping of the control gate are independent on one another. The resistivity of the control gate may be considerably reduced which is of advantage for reducing the propagation times of the signals when the signals are transmitted by the gate and the layer associated with it.

This characteristic is of advantage in circuits of large surface area.

On the other hand, so far as production costs are concerned, the process according to the invention manages with a number of photoetchings identical with the process for producing the known transistor illustrated in FIG. 1, of which the disadvantages were mentioned earlier on.

Accordingly, the process according to the invention is distinguished in particular by the use of one layer of polycrystalline silicon for simultaneously performing three completely different functions, two of which occur in one and the same step of the process.

These two functions are, on the one hand, the formation by diffusion of the source and drain electrodes of a transistor and, on the other hand, the formation by diffusion of its channel. The third function is the connection of the source and drain regions to the external contacts.

Thus, the fact that steps performing several functions, which previously were carried out separately by different processes, are combined into a single process represents a significant improvement over the prior art, contributing to a common object of reducing the dimensions of the devices obtained and also the production costs.

What is claimed is:

1. A method for making an insulated gate field effect transistor of the type having a source region with a source contact electrode of polycrystalline silicon, a drain region with a drain contact electrode of polycrystalline silicon, and a channel region between the source and drain regions with an insulated control gate above the channel region, the method comprising the steps of:
   providing a semiconductor substrate;
   forming source and drain contact electrodes of polycrystalline silicon on the upper surface of the semiconductor substrate, each of said electrodes being doped with an impurity of a first type of conductivity and wherein at least one of the source and drain electrodes contains an impurity of the opposite type of conductivity to said first type and has a rate of diffusion greater than the rate of diffusion of the impurity of the first type of conductivity; and
   heating the substrate so as to simultaneously form a source region and a drain region in the semiconductor substrate by diffusion of the impurity of the first type of conductivity from the electrodes into the substrate so as to produce a laterally diffused part of the channel adjacent to the source or drain region, said step of heating being effected at a predetermined temperature during a predetermined time to control the length of the laterally diffused part of the channel.

2. A method according to claim 1, wherein the electrode having two types of doping impurities is the source electrode.

3. A method according to claim 1, wherein the insulated control gate covers only part of the channel region, said part including the laterally diffused part of the channel region.

4. A method according to claim 1, wherein the two types of doping impurities are respectively boron and arsenic.

5. A method according to claim 1, wherein the polycrystalline silicon of the electrodes is doped with arsenic during a vapor-phase deposition step.

6. A method according to claim 1, wherein the polycrystalline silicon of the electrodes is doped with arsenic by ion implantation.

7. A method according to claim 1, wherein the polycrystalline silicon of one of the electrodes is doped with boron by ion implantation over a portion of its surface delimited by a mask.

8. A method according to claim 1, wherein the gate is formed by deposition and etching of polycrystalline silicon.

9. A method according to claim 1, wherein the gate is formed by deposition and etching of a refractory metal.

10. A method according to claim 9, wherein said refractory metal is molybdenum.

11. A method for producing an N- channel MOS transistor in a semiconductor substrate of P- type conductivity, comprising the steps of:
   providing a substrate;
   forming on one face of the substrate a field layer of silicon oxide and forming an opening in this layer to expose the surface of the substrate;
   depositing a layer of polycrystalline silicon doped with an N- type impurity over the entire said one face of the substrate,
   forming a mask on a portion of said one face of the substrate, comprising an edge of the opening, in the oxide field layer and doping the unmasked portion of the layer of polycrystalline silicon with a P- type impurity, forming another layer of silicon oxide on the layer of polycrystalline silicon and forming a common opening in these layers to expose the surface of the substrate, heating the substrate for simultaneously forming the source region, drain region and a diffusion part of the channel region by diffusion of impurities contained in remaining portions of polycrystalline silicon in contact with the semiconductor substrate, forming a thin layer of silicon oxide during the heating step or at the end of it, forming a control gate on the thin layer of silicon oxide above the diffused part of the channel region, forming another layer of silicon oxide over the entire said one face of the substrate, forming openings in said other layer to expose the surface of portions of the layer of polycrystalline silicon and depositing metallic contacts on these portions.

12. An N- channel MOS transistor formed by a process comprising the following steps:

providing a semiconductor substrate;

forming a source contact electrode and a drain contact electrode of polycrystalline silicon on the upper surface of the semiconductor substrate, said electrodes both being doped with an impurity of a first ype of conductivity and wherein at least one of the source and drain electrodes contain an impurity of the opposite type of conductivity to said first type and having a diffusion speed greater than the diffusion speed of the impurity of the first type of conductivity; and heating the substrate so as to simultaneously form source and drain regions in the semiconductor substrate by diffusion of the impurity of the first type of conductivity from the electrodes into the substrate so as to produce a laterally diffused part of the channel adjacent to the source or drain region, said step of heating being effected at a predetermined temperature during a predetermined time to control the length of the laterally diffused part of the channel.

13. An N- channel MOS transistor formed by a process comprising the following steps:

providing a substrate;

forming on one face of the substrate a field layer of silicon oxide and forming an opening in this layer to expose the surface of the substrate;

depositing a layer of polycrystalline silicon doped with an N- type impurity over the entire said one face of the substrate, forming a mask on a portion of said one face of the substrate, comprising an edge of the opening, in the oxide field layer and doping the unmasked portion of the layer of polycrystalline silicon with a P- type impurity, forming another layer of silicon oxide on the layer of polycrystalline silicon and forming a common opening in these layers to expose the surface of the substrate, heating the substrate for simultaneously forming the source region, drain region and a diffusion part of the channel region by diffusion of impurities contained in remaining portions of polycrystalline silicon in contact with the semiconductor substrate, forming a thin layer of silicon oxide during the heating step or at the end of it, forming a control gate on the thin layer of silicon oxide above the diffused part of the channel region, forming another layer of silicon oxide over the entire said one face of the substrate, forming openings in said other layer to expose the surface of portions of the layer polycrystalline silicon and depositing metallic contacts on these portions.

* * * * *